US007223651B2

(12) United States Patent
Richter et al.

(10) Patent No.: US 7,223,651 B2
(45) Date of Patent: May 29, 2007

(54) DRAM MEMORY CELL WITH A TRENCH CAPACITOR AND METHOD FOR PRODUCTION THEREOF

(75) Inventors: Frank Richter, Dresden (DE); Dietmar Temmler, Dresden (DE); Andreas Wich-Glasen, Langebrück (DE)

(73) Assignee: Infineon Technologies, AG, Munich (DE)

( * ) Notice: Subject to any disclaimer, the term of this patent is extended or adjusted under 35 U.S.C. 154(b) by 180 days.

(21) Appl. No.: 10/479,522

(22) PCT Filed: Jun. 5, 2002

(86) PCT No.: PCT/DE02/02046

§ 371 (c)(1),
(2), (4) Date: Jun. 17, 2004

(87) PCT Pub. No.: WO02/101824

PCT Pub. Date: Dec. 19, 2002

(65) Prior Publication Data

US 2004/0227174 A1  Nov. 18, 2004

(30) Foreign Application Priority Data

Jun. 11, 2001 (DE) .................................. 101 28 211

(51) Int. Cl.
*H01L 21/8234* (2006.01)

(52) U.S. Cl. ...................... 438/238; 438/242; 438/243; 438/245; 438/246; 438/248; 438/259; 438/270; 438/386; 438/387; 438/388; 438/389; 438/391; 438/561; 257/E21.653

(58) Field of Classification Search ........ 438/244–246, 438/248, 387–389, 391, 561; 257/304
See application file for complete search history.

(56) References Cited

U.S. PATENT DOCUMENTS

| 5,214,603 | A | * | 5/1993 | Dhong et al. ............... 365/207 |
| 5,618,745 | A | * | 4/1997 | Kita ............................ 438/164 |
| 5,847,374 | A | | 12/1998 | Menconi |
| 5,998,821 | A | | 12/1999 | Hieda et al. |

(Continued)

FOREIGN PATENT DOCUMENTS

EP  0234384 A1  9/1987

(Continued)

*Primary Examiner*—Michael Lebentritt
*Assistant Examiner*—Kyoung Lee
(74) *Attorney, Agent, or Firm*—Edell, Shapiro & Finnan, LLC (57) ABSTRACT

A memory cell includes a selection transistor and a trench capacitor. The trench capacitor is filled with a conductive trench filling on which an insulating covering layer is arranged. The insulating covering layer is laterally overgrown, proceeding from the substrate with a selectively grown epitaxial layer. The selection transistor is formed in the selectively grown epitaxial layer, comprises a source region connected to the trench capacitor and a drain region connected to a bit line. The junction depth of the source region is chosen so that the source region reaches as far as the insulating covering layer. Optionally, the thickness of the epitaxial layer can be reduced to a thickness by oxidation and a subsequent etching. Afterwards, a contact trench is etched through the source region down to the conductive trench filling, which trench is filled with a conductive contact and electrically connects the conductive trench filling to the source region.

22 Claims, 5 Drawing Sheets

U.S. PATENT DOCUMENTS 6,326,262 B1 12/2001 Tmmler et al.
2002/0137278 A1 9/2002 Temmler et al.
2003/0168690 A1 9/2003 Karcher et al.

FOREIGN PATENT DOCUMENTS

| EP | 0463459 A1 | 6/1991 |
| JP | 63151070 A | 6/1988 |
| WO | WO 01/39248 A2 | 5/2001 |

\* cited by examiner

DRAM MEMORY CELL WITH A TRENCH CAPACITOR AND METHOD FOR PRODUCTION THEREOF

FIELD OF THE INVENTION

The present application relates to a memory having a memory cell, and more particularly, to a memory comprising a selection transistor and a storage capacitor, and to a method for fabricating it.

BACKGROUND

Integrated circuits (ICs) or chips contain capacitors for the purpose of storing charge, such as, for example, a dynamic random access memory (DRAM). In this case, the charge state in the capacitor represents a data bit.

A DRAM chip contains a matrix of memory cells, which are arranged in the form of rows and columns, and are addressed by word lines and bit lines. The reading of data from the memory cells or the writing of data to the memory cells is realized by activating suitable word lines and bit lines.

A DRAM memory cell usually contains a transistor connected to a capacitor. The transistor is referred to as a selection transistor and comprises, inter alia, two doping regions isolated from one another by a channel which is controlled by a gate. Depending on the direction of current flow, one doping region is referred to as the drain region and the other as the source region. The source region is connected for example to the trench capacitor, the drain region is connected to a bit line and the gate is connected to a word line. By the application of suitable voltages to the gate, the transistor is controlled in such a way that a current flow between the source region and the drain region through the channel is switched on and off.

The charge stored in the capacitor decreases over time on account of leakage currents. Before the charge has decreased to a level below a threshold value, the storage capacitor must be refreshed. For this reason, these memories are referred to as dynamic RAM (DRAM).

The central problem in known DRAM variants based on a trench capacitor is the production of a sufficiently large capacitance for the trench capacitor. This problem will be aggravated in future by the advancing miniaturization of semiconductor components. The increase in the integration density means that the area available per memory cell and thus the capacitance of the trench capacitor decrease ever further.

Sense amplifiers require a sufficient signal level for reliably reading out the information situated in the memory cell. The ratio of the storage capacitance to the bit line capacitance is crucial in determining the signal level. If the storage capacitance is too low, the ratio may be too small for generating an adequate signal.

A lower storage capacitance likewise requires a higher refresh frequency, because the quantity of charge stored in the trench capacitor is limited by its capacitance and additionally decreases due to leakage currents. If the quantity of charge falls below a minimum quantity of charge in the storage capacitor, then it is no longer possible for the information stored therein to be read out by a connected sense amplifier, the information is lost and read errors arise.

One way of avoiding read errors is to reduce the leakage currents. Leakage currents can be reduced on the one hand by transistors and on the other hand by dielectrics, such as the capacitor dielectric, for example. An undesirably reduced retention time can be lengthened by these measures.

Stacked capacitors or trench capacitors are usually used in DRAMs. In this case, a trench capacitor has a three-dimensional structure which is formed in a silicon substrate, for example. An increase in the capacitor electrode area, and thus, in the capacitance of the trench capacitor, can be achieved, for example, by etching more deeply into the substrate, and, thus by deeper trenches. In this case, the increase in the capacitance of the trench capacitor does not cause the substrate surface occupied by the memory cell to be enlarged. However, this method is also limited, since the attainable etching depth of the trench capacitor depends on the trench diameter, and, during fabrication, it is only possible to attain specific, finite aspect ratios between the trench depth and trench diameter.

As the increase in the integration density advances, the substrate surface available per memory cell decreases ever further. The associated reduction in the trench diameter leads to a reduction in the capacitance of the trench capacitor. If the capacitance of the trench capacitor is dimensioned to be so low that the charge which can be stored is insufficient for entirely satisfactory read out by the sense amplifiers connected downstream, then this results in read errors.

This problem is explained, for example, in the document DE 199 41 148, the selection transistor, which is usually arranged next to the trench capacitor, being arranged above the trench capacitor. As a result, the trench of the trench capacitor can take up a part of the substrate surface which was conventionally reserved for the transistor. Through this arrangement, the trench capacitor and the transistor share part of the substrate surface. This arrangement is made possible by an epitaxial layer grown above the trench capacitor.

What is problematic, however, is the electrical connection of the trench capacitor to the transistor. Purely lithographic methods for fabricating the electrical connection require a minimum distance between the trench capacitor and the transistor for the lithographic alignment of the individual lithographic planes with respect to one another. Through purely lithographic methods, the memory cells in the memory cell array require a relatively large area and are unsuitable for integration in a large-scale integrated cell array.

What is disadvantageous about the memory cells known from the prior art is that the resistance of the electrical connection between the trench capacitor and the source region of the transistor has a relatively large value, which slows down the access to the memory cell.

A further disadvantage of the prior art is that a sufficient retention time is only achieved by complex insulation measures which require a large number of processing steps. In this case, the electrical contact is insulated from the substrate in a complex manner.

SUMMARY

The present invention is explained with regard to a DRAM memory cell of a semiconductor memory. For discussion purposes, the invention is described in respect of the formation of an individual memory cell.

The object of the present invention is to specify a memory having a memory cell, comprising a selection transistor and a storage capacitor, and a method for fabricating it in which the retention time is improved.

With regard to the memory, the object is achieved by a memory having a memory cell, comprising:

a substrate having a substrate surface and a trench, in which is arranged a trench capacitor filled with a conductive trench filling, on which an insulating covering layer is arranged in the trench;

a selectively grown epitaxial layer, which, proceeding from the substrate surface, extends laterally over the insulating covering layer and is arranged on the substrate surface and the insulating covering layer;

a selection transistor, which comprises a source region, a drain region, a gate oxide and a gate electrode, the source region and the drain region being arranged in the epitaxial layer and the gate oxide being arranged on the epitaxial layer and the source region extending from a surface of the epitaxial layer that is remote from the substrate as far as the insulating covering layer;

a conductive contact, which is arranged in a contact trench—arranged in the epitaxial layer and the insulating covering layer—on the conductive trench filling and connects the source region to the conductive trench filling.

The source region extends from the surface of the epitaxial layer as far as the insulating covering layer, so that a pn junction is arranged here between the doping of the source region, on the one hand, and of the channel region and of the bulk region, on the other hand, which pn junction prevents an uncontrolled current flow and leakage currents. The current flow through the channel can be controlled by the gate electrode, so that the transistor can be switched on and off in a defined manner. Furthermore, it is advantageous that, in the memory according to the invention, complex insulation of the conductive contact can be dispensed with since leakage currents are already avoided by the advantageous configuration of the source region. Consequently, it is possible to form the conductive contact between the source region and the conductive trench filling with an enlarged cross-sectional area, which enables a lower contact resistance. Consequently, the speed of the memory cell and of the memory is also improved.

The doping for the source region and the doping for the drain region can be introduced into the epitaxial layer in two separate process steps, so that the source region can be formed, for example, with a significantly larger junction depth than the drain region. The planar junction depth of the source region is advantageous since it avoids a floating body effect, since the substrate is connected to the channel of the transistor with the substrate. Furthermore, an improved overlay tolerance is made possible by the planar doped drain region, since the transistor, with a drain region formed in a correspondingly planar manner, can also be arranged entirely above the trench capacitor and the floating body effect is nevertheless avoided.

The additional collar insulation in the lower region of the conductive contact, which collar insulation is known from the prior art and is absolutely necessary therein, can thus be obviated. This is made possible by the variation of the doping profile of the source region. Thus, by way of example, the junction depth of the source region is chosen in such a way that it reaches as far as the insulating covering layer. The process steps required from the prior art, such as the deposition of a CVD insulation collar (Chemical Vapour Deposition), the subsequent plasma etching for patterning the insulation collar, a chemical cleaning, the deposition of an arsenic-doped polycrystalline silicon, the plasma etching and a further wet etching, can thus be obviated. Consequently, a reduction in costs also results for the memory according to the invention in comparison with memories known from the prior art.

One refinement of the invention provides for the gate electrode to be arranged on the epitaxial layer and at least partly to cover the trench. This arrangement has the advantage that the selection transistor can be arranged in a space-saving manner above the trench capacitor, in the epitaxial layer, so that the individual memory cells are arranged with a reduced space requirement.

A further refinement of the memory cell according to the invention provides for a trench isolation, proceeding from the surface of the epitaxial layer that is remote from the substrate, to reach into the substrate beyond the insulating covering layer in order to isolate adjacent memory cells from one another.

The trench isolation is usually referred to as STI (Shallow Trench Isolation) and in this case is formed in such a way that, proceeding from the surface of the epitaxial layer that is remote from the substrate, it reaches through the epitaxial layer at least as far as the insulating covering layer. In this case, the trench isolation can perfectly well be introduced more deeply into the substrate and, for example, occupy part of the space originally taken up by the trench of the trench capacitor. Thus, the STI replaces part of the trench and of the conductive trench filling with an insulation material.

A further refinement of the memory cell according to the invention provides for a second gate electrode to be arranged as passing word line on the trench isolation and for the contact trench to be arranged between the first gate electrode and the second gate electrode with the conductive contact situated therein. The arrangement of the contact trench between the first gate electrode and the second gate electrode enables the contact trench to be formed in a self-aligned manner between the first gate electrode and the second gate electrode.

A further refinement of the memory cell according to the invention provides for the epitaxial layer to have a thickness of between 25 nm and 100 nm, preferably between 40 nm and 80 nm. An epitaxial layer having a layer thickness in the ranges specified has the advantage that the junction depth of the source region can be formed according to the invention in such a way that the source region reaches as far as the insulating covering layer. The drain region is formed in such a planar manner that a floating body effect is avoided. By way of example, for this purpose, the drain region can be formed with an implantation depth which approximately corresponds to half the thickness of the epitaxial layer. This is likewise possible if the channel length of the selection transistor assumes a value of between 20 nm and 300 nm.

In this case, the epitaxial layer in which the selection transistor is arranged is formed with an improved uniformity.

A further refinement of the memory cell according to the invention provides for an insulating encapsulation to be arranged on a surface of the first gate electrode that is remote from the substrate and on side areas adjoining said surface of said electrode. The insulating encapsulation has the advantage that it can be used as an etching mask for the self-aligned formation of the contact trench. Furthermore, it is possible to use the insulating encapsulation as a self-aligned etching mask for the formation of a bit line contact which connects the drain region to a bit line.

A further refinement of the memory cell according to the invention provides for an intermediate layer to be arranged in the contact trench between the conductive trench filling and the conductive contact or between the conductive trench filling and the source region for the purpose of avoiding crystal dislocations or for the purpose of controlling a diffusion. The intermediate layer may be configured, for example, as a conductive layer. The intermediate layer may likewise be formed as an insulating layer which, however, is formed with such a small thickness that a large tunnelling current can flow through it. Usually, the layer thickness is then at most two nanometers. The intermediate layer has the advantage that crystal dislocations, which are possibly arranged in the conductive trench filling, cannot be propagated into the selection transistor and, consequently, also cannot damage the source region and the pn junction between source region and bulk region. Furthermore, the diffusion of dopant can be prevented by the intermediate layer, so that dopant originating from the conductive contact is not added to the channel. Consequently, the intermediate layer can reduce leakage currents.

With regard to the method, the object is achieved by a method for fabricating a memory having a memory cell, which has a selection transistor having a source region, a drain region, a gate oxide and a gate electrode, and also a trench capacitor having an inner electrode, an outer electrode and an insulating layer arranged in between, having the steps of:

providing a substrate with a trench;
filling the trench with a conductive trench filling for the purpose of forming the inner electrode of the trench capacitor;
forming an insulating covering layer on the conductive trench filling;
growing an epitaxial layer on the substrate, the epitaxial layer growing laterally, proceeding from the substrate, over the insulating covering layer, so that the epitaxial layer at least partly covers the insulating covering layer;
forming a trench isolation in the epitaxial layer for the purpose of isolating adjacent memory cells;
forming the first gate electrode on the epitaxial layer and a second gate electrode for a passing word line on the trench isolation;
introducing dopant for the purpose of forming the source region and the drain region, a predetermined thickness of the epitaxial layer and the doping being chosen in such a way that the source region reaches from the surface of the epitaxial layer that is remote from the substrate as far as the insulation layer;
etching a contact trench between the first gate electrode and the second gate electrode, the epitaxial layer and the insulating covering layer being removed from the region between the first gate electrode and the second gate electrode and the conductive trench filling being uncovered;
introducing a conductive contact into the contact trench for the purpose of electrically connecting the source region to the conductive trench filling.

In an advantageous manner, the source region is in this case formed with a junction depth which reaches as far as the insulating covering layer. As already explained in connection with the claimed memory, this improves the memory behaviour and the retention time of the memory and also reduces the resistance of the conductive contact to the electrical connection of the conductive trench filling to the source region.

An advantageous refinement of the method according to the invention provides for the epitaxial layer to be thinned to a predetermined thickness. This is advantageous since the epitaxial layer can thus be reduced to a thickness which is smaller than the source region junction depth used, so that the source region reaches as far as the insulating covering layer.

During the formation of the epitaxial layer, the epitaxial layer is grown laterally proceeding from the substrate over the insulating covering layer situated in the trench. In order to completely cover the insulating covering layer, the selective epitaxial layer is formed with a thickness which is greater than half the diameter of the trench. Since this thickness can perfectly well be larger than an expedient junction depth of the source region of the selection transistor, the epitaxial layer is subsequently correspondingly thinned.

An advantageous refinement of the method according to the invention provides for the epitaxial layer to be thinned to a thickness of between 25 nm and 100 nm, preferably to a thickness of between 40 nm and 80 nm. The specified thicknesses for the epitaxial layer are advantageously suited to the fact that the junction depth of the source region can be formed through the entire epitaxial layer and reaches as far as the insulating covering layer.

A further advantageous refinement of the method according to the invention provides for the epitaxial layer, in order to be thinned, to be partly oxidized to form an oxide layer and the oxide layer to be removed selectively with respect to the remainder of the epitaxial layer.

A further advantageous variant of the method according to the invention provides for the epitaxial layer to be thinned by means of chemical mechanical polishing. Chemical mechanical polishing (CMP) is likewise suitable for thinning the epitaxial layer. In this case, however, it must be taken into account that at least a further thinning by oxidation should be carried out since a surface polished CMP is greatly roughened and should be improved, if a channel of a transistor is arranged in this surface.

A further advantageous refinement of the method according to the invention provides for the oxidation of the epitaxial layer to be carried out as wet oxidation at a temperature of between 900° C. and 1100° C. A wet oxidation is suitable for oxidizing the epitaxial layer, for example, on account of the sufficient speed for the formation of the oxide layer.

A further method variant provides for the oxidation to be carried out in an atmosphere containing hydrogen peroxide and hydrogen. The aforementioned atmosphere is suitable for a wet oxidation, for example.

A further advantageous refinement of the method according to the invention provides for the oxide layer to be removed wet-chemically.

The method according to the invention is developed to the effect that the surface of the conductive trench filling that is uncovered after the etching of the contact trench is cleaned, the surface being oxidized and the oxide layer formed in the process being removed. The cleaning of the conductive trench filling has the advantage that it is possible to form an electrical contact with a reduced contact resistance between the conductive trench filling and the subsequently formed conductive contact.

A further refinement of the method according to the invention provides for the conductive contact to be formed by a selective deposition. A selective deposition can be carried out, for example, as a selective silicon deposition, the grown silicon growing only on silicon, such as, for example, monocrystalline silicon or polycrystalline silicon. The selectivity is established in the fact that the grown silicon does not grow for example on a silicon oxide layer, a silicon nitride layer or other materials. The selectivity of the deposition can be set, for example, by suitable process parameters.

The respective subclaims relate to further advantageous refinements of the invention.

BRIEF DESCRIPTION OF THE FIGURES

The invention is explained in more detail below with reference to exemplary embodiments and figures.

In the figures.

DETAILED DESCRIPTION

Figure 1:
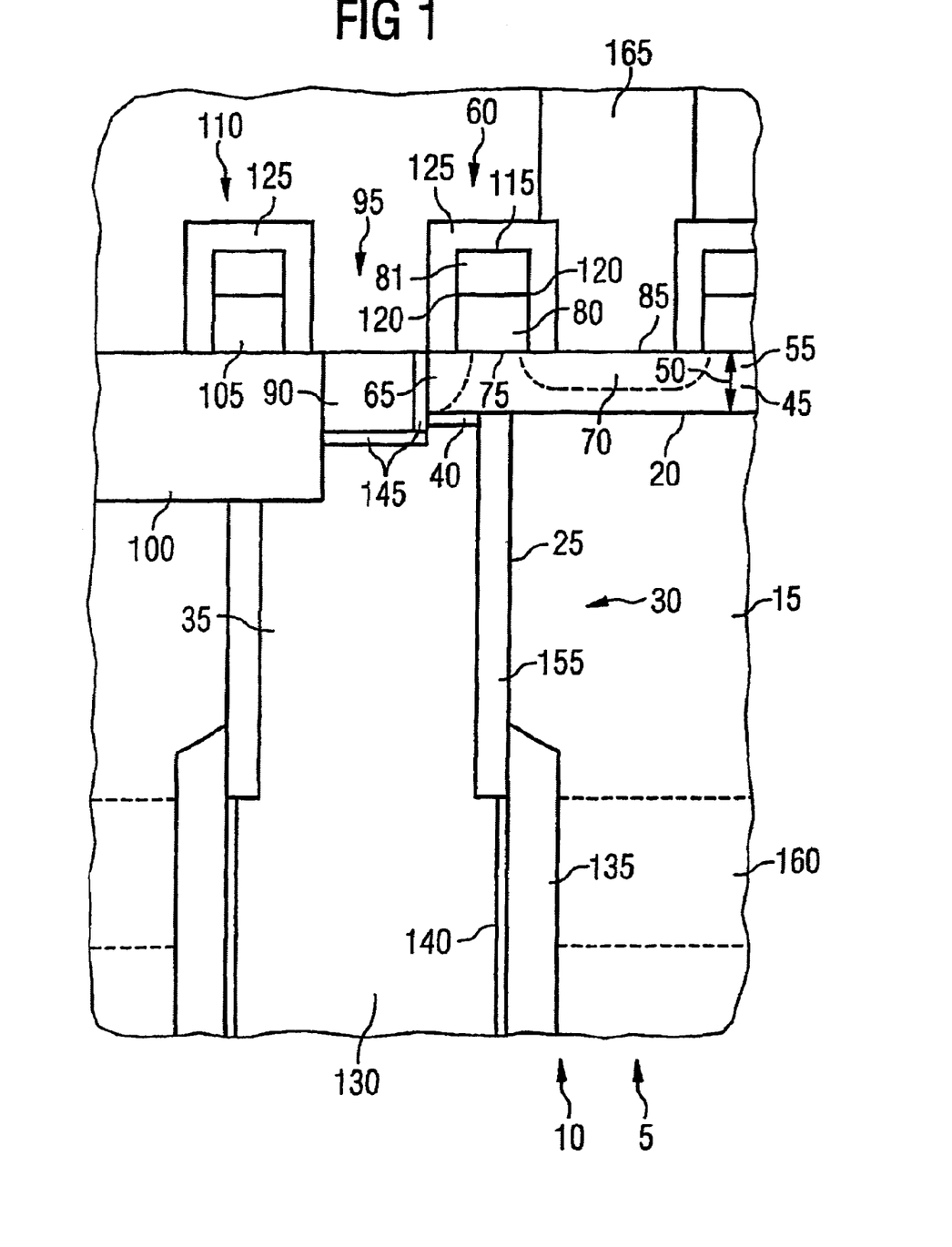
FIG. 1 shows a sectional diagram of a memory cell according to the invention.

FIG. 1 illustrates a memory cell 10 of a memory 5 in a substrate 15 in a sectional diagram. A trench 25 is arranged in the substrate 15, which has a substrate surface 20. A trench capacitor 30 is formed as a storage capacitor in the trench 25. The storage capacitor comprises an inner electrode 130, an outer electrode 135, and an insulating layer 140 arranged between the inner electrode 130 and the outer electrode 135. The inner capacitor electrode 130 is formed, for example, by the conductive trench filling 35 arranged in the trench 25.

An insulating covering layer 40 is arranged on the conductive trench filling 35 in the trench 25. A selectively grown epitaxial layer 45 is arranged on the substrate 15 and the insulating covering layer 40. The selectively grown epitaxial layer 45 has a thickness 50. The thickness 50 corresponds, for example, to a predetermined thickness 55.

A selection transistor 60 is arranged in the selectively grown epitaxial layer 45, the transistor comprising a source region 65, a drain region 70, a gate oxide 75 and a first gate electrode 80. Arranged on the first gate electrode 80 is a conductive layer 81, which is suitable for configuring the arrangement comprising gate electrode 80 and conductive layer 81 as a low-resistance word line. The gate oxide 75 and the first gate electrode 80 are arranged on the surface 85 of the epitaxial layer 45 that is remote from the substrate.

A trench isolation 100 is arranged beside the epitaxial layer 45, in the substrate 15. The trench isolation 100 extends into the substrate 15 from the surface 85 that is remote from the substrate, the trench isolation 100 occupying at least part of the volume originally taken up by the trench 25. A second gate electrode 105 is arranged on the trench isolation 100. The second gate electrode 105 is part of a passing word line which is provided for addressing adjacent memory cells.

An insulating encapsulation 125 is arranged on the surface of the first gate electrode 115 that is remote from the substrate and the adjoining side areas 120. The insulating encapsulation 125 is suitable, for example, for forming a contact trench 95 in which the conductive contact 90 is arranged.

An intermediate layer 145 is optionally arranged between the conductive contact 90 and the conductive trench filling 35. The intermediate layer 145 may likewise optionally be arranged between the conductive contact 90 and the source region 65. In this case, the conductive contact 90 serves for electrically connecting the source region 65 to the conductive trench filling 35. An insulation collar 155 is arranged in the upper region of the trench 25.

In order to make contact with the outer electrode 135 of the trench capacitor 30, a buried well 160 is introduced into the substrate 15. The insulation collar 155 serves for avoiding leakage currents between the outer electrode 135 through the substrate 15 to the source region 65 or the drain region 70. On the drain region 70, a bit line contact 165 is arranged on the surface 85 of the epitaxial layer 45 that is remote from the substrate, beside the first gate electrode 80.

The substrate is formed, for example, from lightly p-doped silicon and is of monocrystalline configuration. The conductive trench filling comprises, for example, doped polycrystalline silicon. The insulating covering layer 40 is formed, for example, from silicon oxide and could likewise comprise silicon nitride. The selectively grown epitaxial layer is likewise formed from silicon or lightly p-doped silicon, in a maimer corresponding to the substrate. The source region 65 and the drain region 70 are formed with a high dopant concentration, the doping of the source region 65 and of the drain region 70 having the opposite polarity to the doping of the substrate. The gate oxide is formed, for example, from silicon oxide or nitrided silicon oxide. The first gate electrode 80 comprises, for example, doped polycrystalline silicon, and the conductive layer 81 contains, for example, a metal or a metal suicide or a metal nitride, such as tungsten, titanium suicide, molybdenum silicide, tungsten silicide, tungsten nitride, titanium nitride, tantalum silicide, or tantalum nitride.

The conductive contact 90 is formed, for example, from highly doped polycrystalline silicon. The trench isolation 100 comprises, for example, doped or undoped silicon oxide. The passing word line 110 with the second gate electrode 105 is formed in a manner corresponding to the first gate electrode 80 with the conductive layer 81. The insulating encapsulation 125 comprises silicon nitride, for example. The inner electrode 130 of the capacitor 30 corresponds to the conductive trench filling 35, and the outer electrode 135 of the trench capacitor 30 is formed, for example, by means of a doping into the substrate 115 around the lower region of the trench capacitor 30. The insulating layer 140 of the trench capacitor 30 comprises, for example, silicon oxide, silicon nitride, or silicon oxynitride.

The intermediate layer 145 is formed, for example, from a metal silicide, a metal nitride, or a silicon nitride. By way of example, titanium silicide, molybdenum silicide, tungsten suicide, or tantalum suicide are suitable as metal silicide. By way of example, titanium nitride, tungsten nitride or tantalum nitride is suitable as metal nitride. The insulation collar 155 comprises, for example, silicon oxide or silicon nitride. The bit line contact 165 comprises a metal, for example.

Figure 2:
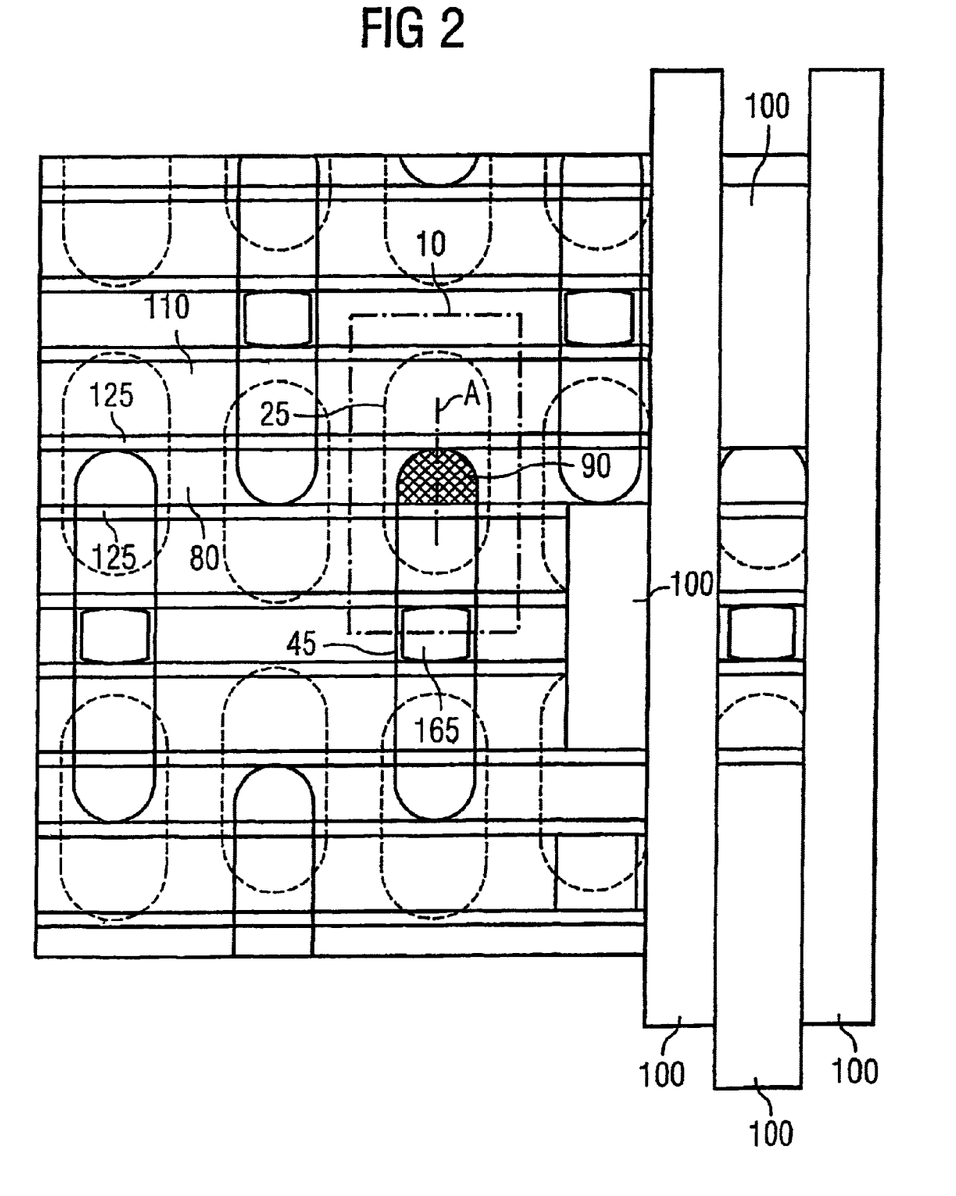
FIG. 2 shows the plan view of a memory cell array of the memory according to the invention.

A plan view of a memory cell array of a memory 5 is illustrated with reference to FIG. 2. The arrangement illustrated in FIG. 1 is, for example, a sectional diagram along the sectional line A—A from FIG. 2. The memory cell 10 comprises the trench 25, the conductive contact 90, the bit line contact 165 and also the selectively grown epitaxial layer 45. The memory cell 10 is isolated from adjacent memory cells by the trench isolation 100. In this case, the first gate electrode 80 runs over the epitaxial layer 45. The first gate electrode 80 is lined with the insulating encapsulation 125. The passing word line 110 runs adjacent to the first gate electrode 80.

A method for fabricating the memory cell 10 illustrated in FIG. 1 is described with reference to FIGS. 3 to 8.

Figure 3:
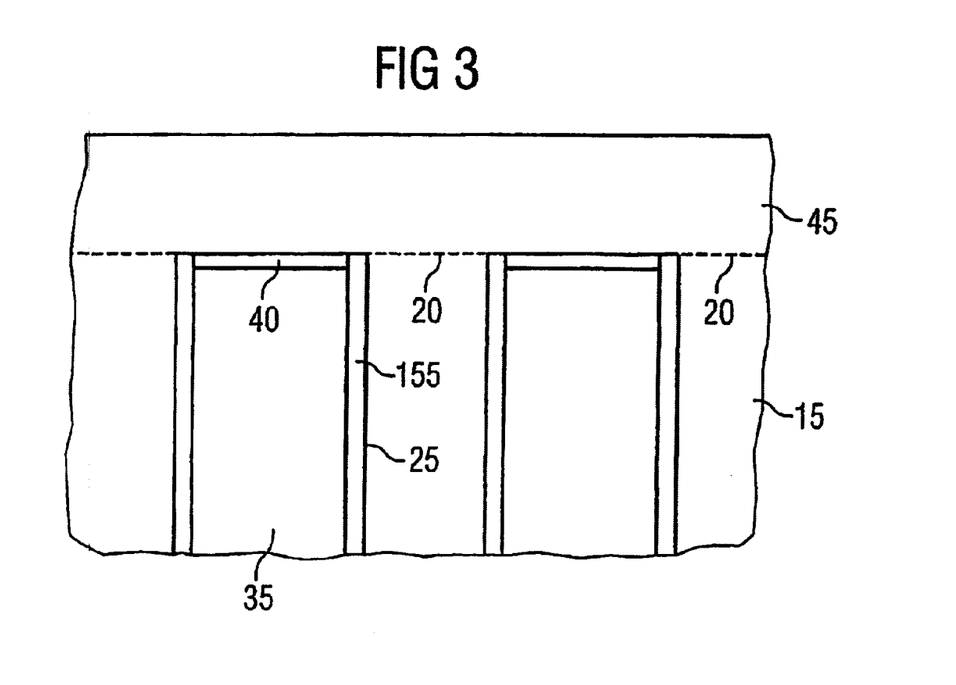
FIG. 3 shows a substrate with a selectively grown epitaxial layer.

FIG. 3 illustrates the substrate 15, in which the trench 25 is arranged. In the upper region of the trench 25 illustrated, the insulation collar 155 is arranged at the sidewall of the trench 25 and the trench 25 is filled with the conductive trench filling 35. The insulating covering layer 40 is arranged in the trench 25, on the conductive trench filling 35. Afterwards, the epitaxial layer 45 is grown selectively, proceeding from the substrate surface 20, the trench 25 and the insulating layer 40, which covers the trench being laterally overgrown. The lateral overgrowth takes place, for example, simultaneously from all sides. In this case, the selective epitaxial layer 45 is formed, for example, with a thickness of approximately 300 nm.

Figure 4:
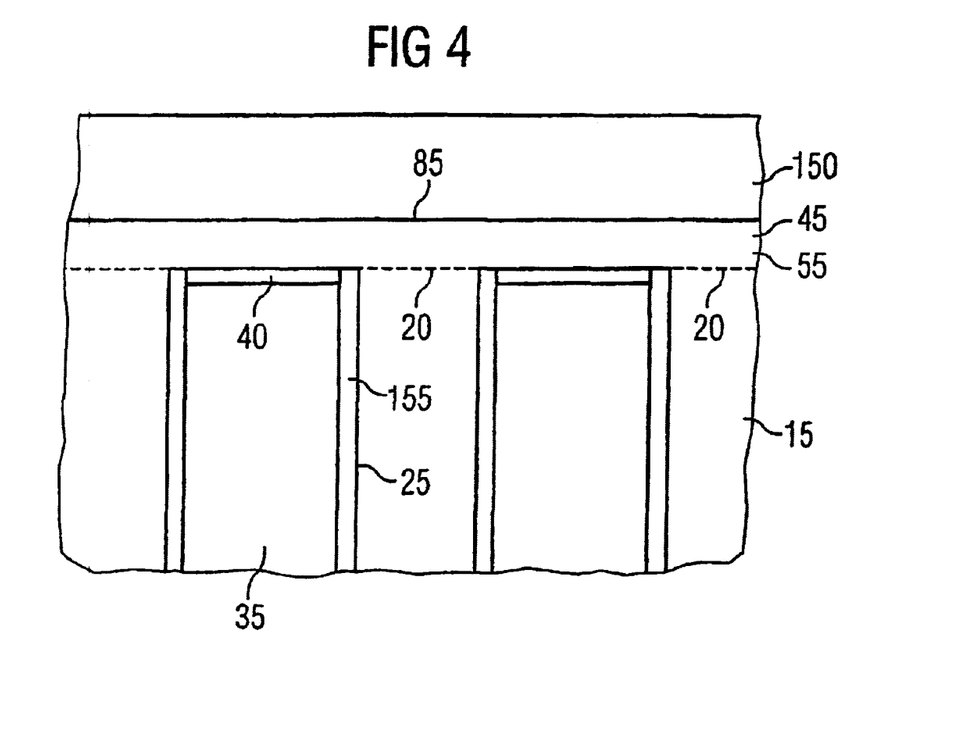
FIG. 4 shows the substrate from FIG. 3, the selective epitaxial layer having been at least partly converted into an oxide layer.

Afterwards, the epitaxial layer 45 formed is thermally oxidized, the epitaxial layer 45 being at least partly converted into an oxide layer 150. The oxidation can be carried out, for example, as a so-called wet oxidation, a wet oxidation usually being characterized by the fact that hydrogen peroxide and hydrogen are present in the atmosphere surrounding the substrate during the oxidation. The wet oxidation can be carried out for example at a temperature of between 900° C. and 1100° C., such as 1000° C., for example, for a time duration of 110 minutes, for example. In this case, an oxide layer having a thickness of approximately 570 nm is typically formed, and the residual height of the epitaxial layer 45 is now about 50 nm, given an epitaxial layer initially having a thickness of 300 nm. During this process, the mixture ratio between hydrogen peroxide to hydrogen can be set to 1.67, for example.

Figure 5:
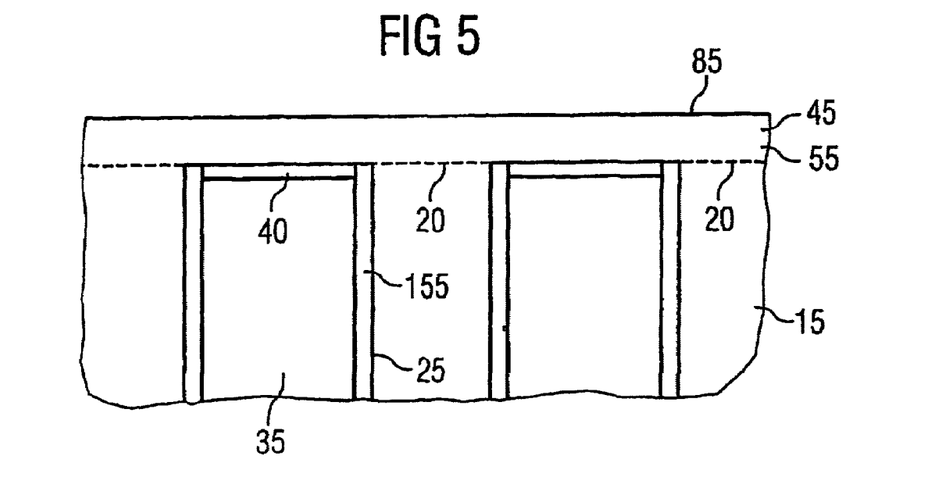
FIG. 5 shows the substrate from FIG. 4, the oxide layer having been removed.

With reference to FIG. 5, the oxide layer 150 is subsequently removed wet-chemically and a cleaning step is optionally carried out on the uncovered surface 85 of the epitaxial layer 45.

Figure 6:
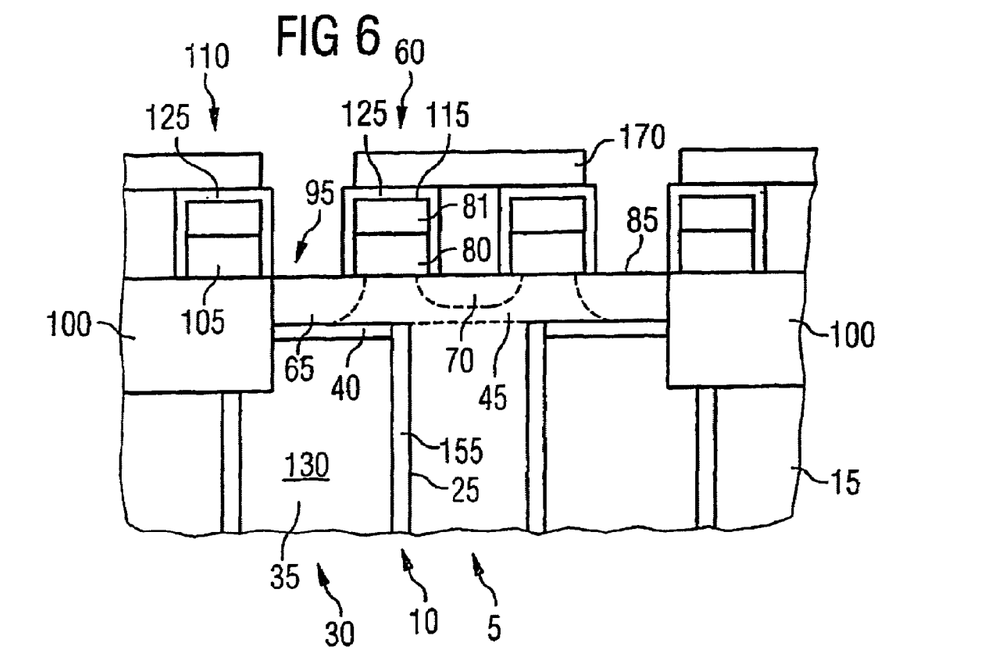
FIG. 6 shows the substrate from FIG. 5, two selection transistors having been formed in and on the in and on the epitaxial layer.

With reference to FIG. 6, the trench isolation 100 is subsequently etched into the epitaxial layer 45, the substrate 15 and the trench capacitor 30 and filled with an insulating material such as silicon oxide, for example. Afterwards, the first gate electrode 80 and the second gate electrode 105 are formed, in this exemplary embodiment a polycrystalline layer and a conductive layer arranged thereon being deposited and patterned together, the first gate electrode 80 being formed together with the conductive layer 81 and the passing word line 110 being formed adjacent thereto.

Afterwards, dopant is introduced into the epitaxial layer 45, the source region 65 and the drain region 70 being formed. The formation of the insulating encapsulation 125 is optionally provided, which encapsulation can also be formed, for example, between two doping steps for the formation of the source region 65 and of the drain region 70. In this case, the source region 65 is formed to such a depth into the epitaxial layer 45 that it reaches as far as the insulating covering layer 40.

Afterwards, by way of example, a BPSG (borophosphorus silicate glass) layer is deposited for planarization purposes and a photosensitive mask 170 is deposited thereon. The photosensitive mask is exposed and patterned, so that the contact trench 95 can be formed between the first gate electrode 80 and the second gate electrode 105. What is advantageous in this case is that the contact trench 95 can be formed selectively with respect to the insulating encapsulation 125. This advantageously has the result that the formation of the contact trench 95 can be carried out in a self-aligned manner.

Figure 7:
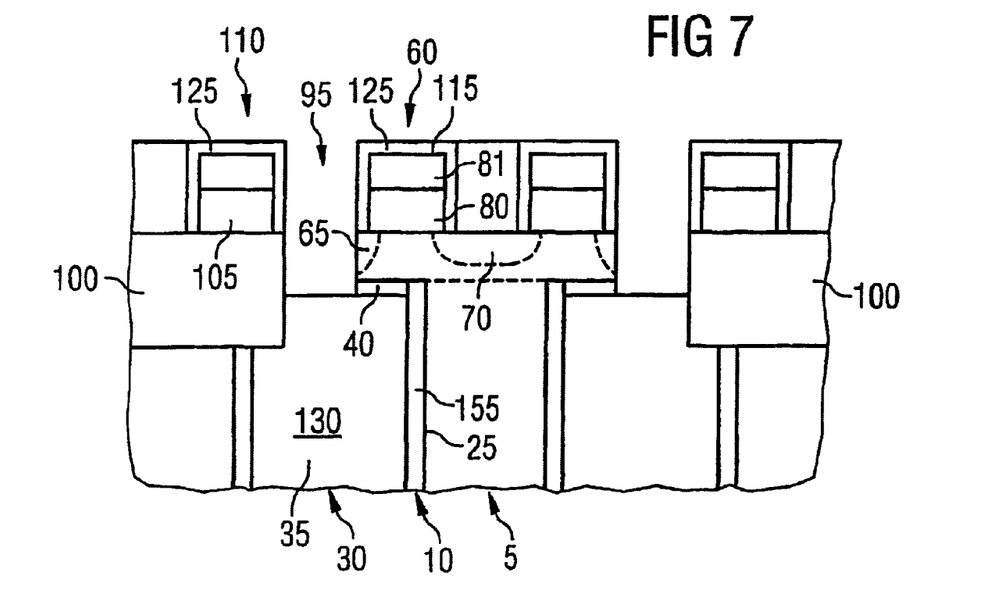
FIG. 7 shows the substrate from FIG. 6, a contact trench having been formed.

With reference to FIG. 7, the epitaxial layer 45 and the insulating covering layer 40 are removed in the region of the contact trench, so that the conductive trench filling 35 is uncovered.

Figure 8:
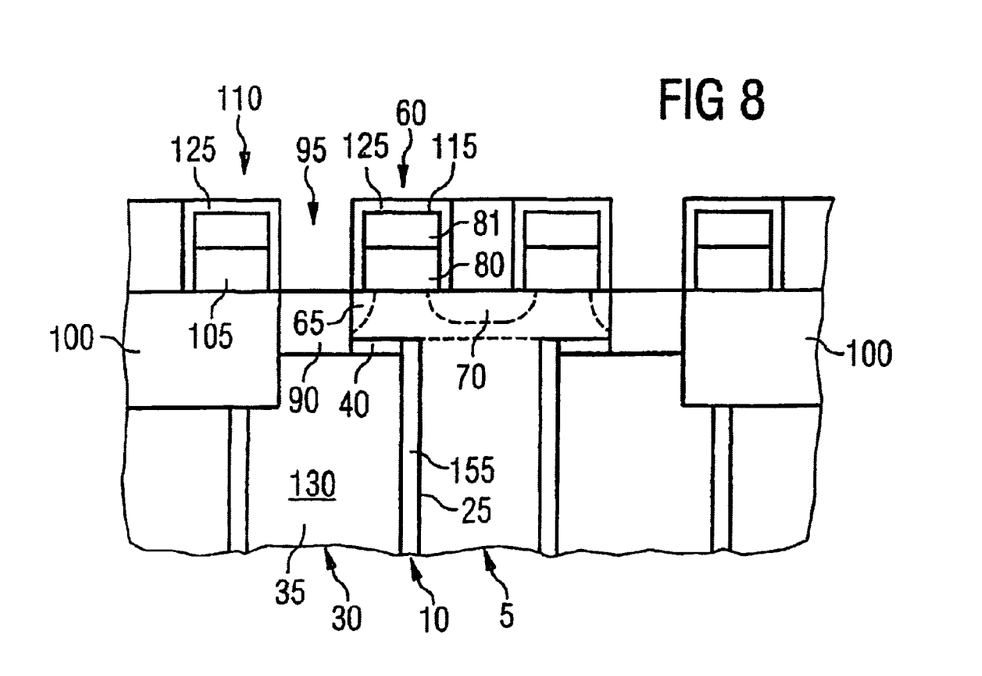
FIG. 8 shows the substrate from FIG. 7, a conductive contact having been formed in the contact trench.

With reference to FIG. 8, the conductive contact 90 is subsequently formed in the contact trench 95, so that the conductive trench filling 35 is electrically connected to the source region 65.

The further method steps which are suitable for forming the bit line contact are carried out in accordance with known methods.

After the application of a selective epitaxial layer having a thickness of approximately 300 nm for the purpose of overgrowing the trench capacitor, the epitaxial layer, in contrast to methods known from the prior art, is partly removed again by oxidation and subsequent etching of the oxide layer formed. As a result, the vertical extent of the conductive contact 90 is reduced from formerly approximately 300 nm to now approximately 50 nm. After the removal of the insulating covering layer 40 and uncovering of the conductive trench filling 35 and an optional cleaning, the conductive contact 90 can subsequently be formed by deposition. This enables an enormous simplification of the connection of the source region 65 to the conductive trench filling 35.

LIST OF REFERENCE SYMBOLS

5 Memory
10 Memory cell
15 Substrate
20 Substrate surface
25 Trench
30 Trench capacitor, storage capacitor
35 Conductive trench filling
40 Insulating covering layer
45 Selectively grown epitaxial layer
50 Thickness of the epitaxial layer
55 Predetermined thickness
60 Selection transistor
65 Source region
70 Drain region
75 Gate oxide
80 First gate electrode
81 Conductive layer
85 Surface of the epitaxial layer that is remote from the substrate
90 Conductive contact
95 Contact trench
100 Trench isolation
105 Second gate electrode
110 Passing word line
115 Surface of the first gate electrode that is remote from the substrate
120 Adjoining side area
125 Insulating encapsulation
130 Inner electrode of the trench capacitor
135 Outer electrode of the trench capacitor
140 Insulating layer
145 Intermediate layer
150 Oxide layer
155 Insulation collar
160 Buried well
165 Bit line contact
170 Mask A Sectional line with respect to FIG. 1

The invention claimed is:

1. A semiconductor memory having a memory cell, comprising:

a substrate having a substrate surface and a trench, the trench having a trench capacitor arranged therein, the trench capacitor being filled with a conductive trench filling;

an insulating covering layer being arranged in the trench;

a selectively grown epitaxial layer proceeding from the substrate surface, the epitaxial layer extending laterally over the insulating covering layer, the epitaxial layer being arranged on the substrate surface and the insulating covering layer, a contact trench being formed in the epitaxial layer and in the insulating covering layer, the epitaxial layer having a sidewall along the contact trench;

a selection transistor, the selection transistor including a source region, a drain region, a gate oxide and a gate electrode, the source region and the drain region being arranged in the epitaxial layer, the gate oxide being arranged on the epitaxial layer, the source region extending in a vertical direction from a surface of the epitaxial layer that is remote from the substrate to the insulating covering layer such that the source region prevents uncontrolled current flow and leakage currents;

a conductive contact, the conductive contact being arranged in the contact trench and on the conductive trench filling, the conductive contact connecting the source region to the conductive trench filling, a conductive connection being formed along a length of the sidewall of the epitaxial layer, the length extending from the end of the sidewall formed at the covering layer as far as the upper end of the conductive contact; and an intermediate layer disposed in the contact trench between the conductive trench filling and the conductive contact, wherein the intermediate layer is formed from an insulating material having a thickness of up to 2 nanometers so as to enable a tunneling current through the intermediate layer.

2. The semiconductor memory according to claim 1, wherein the gate electrode is arranged on the epitaxial layer, the gate electrode at least partly covering the trench.

3. The semiconductor memory according to claim 1, wherein a trench isolation, proceeding from the surface of the epitaxial layer that is remote from the substrate, reaches into the substrate beyond the insulating covering layer in order to isolate adjacent memory cells from one another.

4. The semiconductor memory according to claim 3, wherein a second gate electrode is arranged as a passing word line on the trench isolation, the contact trench is arranged between the first gate electrode and the second gate electrode with the conductive contact situated therein.

5. The semiconductor memory according to claim 1, wherein the epitaxial layer has a thickness of about 25 nm.

6. The semiconductor memory according to claim 1 an insulating encapsulation is arranged on a surface of the first gate electrode that is remote from the substrate and on side areas adjoining the surface of the electrode.

7. The semiconductor memory according to claim 1, wherein the conductive contact touches the sidewall along the length.

8. A method for fabricating a semiconductor memory having a memory cell, the semiconductor memory having a selection transistor, the selection transistor having a source region, a drain region, a gate oxide and a gate electrode, the trench capacitor having an inner electrode, an outer electrode and an insulating layer arranged in between, comprising:

providing a substrate with a trench;

filling the trench with a conductive trench filling to form the inner electrode of the trench capacitor;

forming an insulating covering layer on the conductive trench filling;

growing an epitaxial layer on the substrate, the epitaxial layer growing laterally, proceeding from the substrate, over the insulating covering layer, so that the epitaxial layer at least partly covers the insulating covering layer;

forming a trench isolation in the epitaxial layer for the purpose of isolating adjacent memory cells;

forming the first gate electrode on the epitaxial layer and a second gate electrode for a passing word line on the trench isolation;

introducing dopant to form the source region and the drain region, a predetermined thickness of the epitaxial layer and the doping being chosen so that the source region reaches from the surface of the epitaxial layer that is remote from the substrate as far as the insulation layer;

etching a contact trench between the first gate electrode and the second gate electrode, the epitaxial layer and the insulating covering layer being removed from the region between the first gate electrode and the second gate electrode and the conductive trench filling being uncovered and a sidewall of the epitaxial layer being uncovered;

introducing a conductive contact into the contact trench to electrically conductively connect the source region to the conductive trench filling, a conductive connection being formed along a length of the sidewall of the epitaxial layer, the length extending from the end of the sidewall formed at the covering layer as far as the upper end of the conductive contact.

9. The method according to claim 8, wherein the epitaxial layer is thinned to a predetermined thickness.

10. The method according to claim 8, wherein the epitaxial layer is thinned to a thickness of between 25 nanometers and 100 nanometers.

11. The method according to claim 8, wherein the epitaxial layer, in order to be thinned, is partly oxidized to form an oxide layer, the oxide layer being selectively removed with respect to the remainder of the epitaxial layer.

12. The method according to claim 8, wherein the epitaxial layer is thinned by means of chemical mechanical polishing.

13. The method according to claim 8, wherein the oxidation of the epitaxial layer is carried out as wet oxidation at a temperature of between 900° C. and 1100° C.

14. The method according to claim 13, wherein the oxidation is carried out in an atmosphere containing hydrogen peroxide and hydrogen.

15. The method according to claim 11, wherein the oxide layer is removed wet-chemically.

16. The method according to claim 8, wherein the surface of the conductive trench filling that is uncovered after the etching of the contact trench is cleaned, the surface being oxidized and the oxide layer formed in the process being removed.

17. The method according to claim 8, wherein the conductive contact is formed by means of a selective deposition.

18. The semiconductor memory according to claim 5, wherein the thickness of the epitaxial layer is between 40 nanometers and 80 nanometers.

19. The method according to claim 10, wherein the epitaxial layer is thinned to a thickness between 40 nm and 80 nm.

20. The method according claim 12, wherein the oxidation of the epitaxial layer is carried out as wet oxidation at a temperature of between 900° C. and 1100° C.

21. The method according to claim 20, wherein the oxidation is carried out in an atmosphere containing hydrogen peroxide and hydrogen.

22. A semiconductor memory having a memory cell, comprising:
- a substrate having a substrate surface and a trench, the trench having a trench capacitor arranged therein, the trench capacitor being filled with a conductive trench filling;
- an insulating covering layer being arranged in the trench;
- a selectively grown epitaxial layer proceeding from the substrate surface, the epitaxial layer extending laterally over the insulating covering layer, the epitaxial layer being arranged on the substrate surface and the insulating covering layer, a contact trench being formed in the epitaxial layer and in the insulating covering layer, the epitaxial layer having a sidewall along the contact trench;
- a selection transistor, the selection transistor including a source region, a drain region, a gate oxide and a gate electrode, the source region and the drain region being arranged in the epitaxial layer, the gate oxide being arranged on the epitaxial layer, the source region extending in a vertical direction from a surface of the epitaxial layer that is remote from the substrate to the insulating covering layer such that the source region prevents uncontrolled current flow and leakage currents;
- a conductive contact, the conductive contact being arranged in the contact trench and on the conductive trench filling, the conductive contact connecting the source region to the conductive trench filling, a conductive connection being formed along a length of the sidewall of the epitaxial layer, the length extending from the end of the sidewall formed at the covering layer as far as the upper end of the conductive contact; and
- an intermediate layer disposed in the contact trench between the conductive contact and the source region, wherein the intermediate layer is formed from an insulating material having a thickness of up to 2 nanometers so as to enable a tunneling current through the intermediate layer.

* * * * *